(12) United States Patent
Benedict et al.

(10) Patent No.: US 10,699,796 B2
(45) Date of Patent: Jun. 30, 2020

(54) VALIDATION OF A REPAIR TO A SELECTED ROW OF DATA

(71) Applicant: HEWLETT PACKARD ENTERPRISE DEVELOPMENT LP, Houston, TX (US)

(72) Inventors: Melvin K. Benedict, Magnolia, TX (US); Eric L. Pope, Tomball, TX (US); Lidia Warnes, Roseville, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/310,629

(22) PCT Filed: May 27, 2014

(86) PCT No.: PCT/US2014/039622
§ 371 (c)(1),
(2) Date: Nov. 11, 2016

(87) PCT Pub. No.: WO2015/183245
PCT Pub. Date: Dec. 3, 2015

(65) Prior Publication Data
US 2017/0084350 A1    Mar. 23, 2017

(51) Int. Cl.
*G11C 29/38* (2006.01)
*G11C 29/24* (2006.01)

(52) U.S. Cl.
CPC .............. *G11C 29/38* (2013.01); *G11C 29/24* (2013.01)

(58) Field of Classification Search
CPC ................................ G11C 29/38; G11C 29/24
See application file for complete search history.

(56) References Cited

U.S. PATENT DOCUMENTS

| | | | | |
|---|---|---|---|---|
| 4,296,494 A | * | 10/1981 | Ishikawa | G06F 11/14 714/6.1 |
| 4,939,694 A | * | 7/1990 | Eaton | G11C 29/42 365/200 |
| 5,469,390 A | | 11/1995 | Sasaki et al. | |
| 5,640,286 A | * | 6/1997 | Acosta | G11B 20/10 360/48 |
| 5,936,970 A | * | 8/1999 | Lee | G11C 29/83 714/710 |
| 6,018,482 A | | 1/2000 | Fujita | |
| 6,141,267 A | | 10/2000 | Kirihata et al. | |
| 6,154,851 A | | 11/2000 | Sher et al. | |
| 6,282,689 B1 | | 8/2001 | Seyyedy | |
| 6,704,228 B2 | | 3/2004 | Jang et al. | |
| 7,263,019 B2 | | 8/2007 | Nierle et al. | |
| 7,441,060 B2 | | 10/2008 | Gower et al. | |
| 7,839,707 B2 | | 11/2010 | Aakjer | |

(Continued)

OTHER PUBLICATIONS

International Searching Authority, The International Search Report and the Written Opinion, dated Jan. 27, 2015, 11 Pages.

(Continued)

*Primary Examiner* — Douglas King
(74) *Attorney, Agent, or Firm* — Hewlett Packard Enterprise Patent Department

(57) ABSTRACT

Examples herein disclose selecting a row of data among multiple rows of data for validation of a repair to the selected row of data. The examples here disclose validating the repair to the selected row of data.

12 Claims, 6 Drawing Sheets

(56) References Cited

U.S. PATENT DOCUMENTS

| | | |
|---|---|---|
| 7,948,818 B1 | 5/2011 | Wu et al. |
| 7,996,710 B2 | 8/2011 | Nagaraj et al. |
| 8,509,014 B2 | 8/2013 | Shvydun et al. |
| 8,601,330 B2 | 12/2013 | Jeong et al. |
| 8,670,283 B2 | 3/2014 | Ong et al. |
| 8,861,277 B1 | 10/2014 | Rategh et al. |
| 8,885,426 B1 | 11/2014 | Burstein et al. |
| 9,087,615 B2 | 7/2015 | Cordero et al. |
| 9,165,679 B2 | 10/2015 | Oh et al. |
| 9,349,491 B1 | 5/2016 | Morgan et al. |
| 9,558,851 B2 | 1/2017 | Wilson et al. |
| 2004/0015754 A1 | 1/2004 | Callaway et al. |
| 2004/0246774 A1 | 12/2004 | Van Brocklin et al. |
| 2005/0028038 A1 | 2/2005 | Pomaranski et al. |
| 2006/0036921 A1 | 2/2006 | Callaway et al. |
| 2006/0064618 A1 | 3/2006 | Wu et al. |
| 2007/0058470 A1 | 3/2007 | Nierle et al. |
| 2007/0133323 A1 | 6/2007 | Kim et al. |
| 2008/0304347 A1 | 12/2008 | Kenkare et al. |
| 2009/0190422 A1 | 7/2009 | Khoja et al. |
| 2009/0217093 A1 | 8/2009 | Co |
| 2011/0228614 A1 | 9/2011 | Shaeffer et al. |
| 2011/0280091 A1 | 11/2011 | Rooney et al. |
| 2011/0296258 A1 | 12/2011 | Schechter et al. |
| 2012/0030509 A1 | 2/2012 | Wood et al. |
| 2012/0266016 A1 | 10/2012 | Huang |
| 2013/0010557 A1 | 1/2013 | Rooney et al. |
| 2013/0021859 A1 | 1/2013 | Shvydun et al. |
| 2013/0070547 A1 | 3/2013 | Pyeon |
| 2013/0176768 A1 | 7/2013 | Wang |
| 2013/0223171 A1 | 8/2013 | Kim et al. |
| 2014/0003173 A1 | 1/2014 | Ku |
| 2014/0078842 A1 | 3/2014 | Oh et al. |
| 2016/0350191 A1 | 12/2016 | Chen |

OTHER PUBLICATIONS

Wada, O. et al., Post-packaging Auto Repair Techniques for Fast Row Cycle Embedded DRAM, (Research Paper), Jul. 16, 2004, 8 Pages.

Yung-Fa Chou et al, Reactivation of Spares for Off-Chip Memory Repair After Die Stacking in a 3-D IC With TSVs, In: IEEE Transactions on Circuits and Systems—I: IEEE . . . Sep. 2013, vol. 60, No. 9, pp. 2343-2351, See p. 2344, right column, lines 30-36: p. 2347, left column, lines 28-40; and figures 4. 8.

Intel® 6400/6402 Advanced Memory Buffer, Datasheet, Oct. 2006, 250 pages.

International Search Report and Written Opinion of the International Searching Authority dated Jun. 28, 2016; International Application No. PCT/US2015/045683; 9 pages.

Jae-Kyung Wee, "Antifuse Circuits and Their Applications to Post-Package of DRAMs", Journal of Semiconductor Technology and Science, vol. 1. No. 4, Dec. 2001, 16 pages.

Lu, S-K. et al., Efficient Built-in Redundancy Analysis for Embedded Memories with 2-D Redundancy, (Research Paper), May 10, 2005, 5 Pages.

International Search Report and Written Opinion received for PCT Patent Application No. PCT/US2014/044354, dated Apr. 15, 2015, 10 pages.

International Preliminary Report on Patentability received for PCT Patent Application No. PCT/US2015/045683, dated Mar. 1, 2018, 8 pages.

International Preliminary Report on Patentability received for PCT Patent Application No. PCT/US2014/044354, dated Jan. 5, 2017, 8 pages.

International Preliminary Report on Patentability received for PCT Patent Application No. PCT/US2014/039622, dated Dec. 8, 2016, 7 pages.

\* cited by examiner

VALIDATION OF A REPAIR TO A SELECTED ROW OF DATA

BACKGROUND

Memory technology may continue to shrink in size and increase density. To protect the memory technology and reduce resource costs, repairs to the memory may occur post-packaging and/or while the memories are in service.

BRIEF DESCRIPTION OF THE DRAWING

In the accompanying drawings, like numerals refer to like components or blocks. The following detailed description references the drawings, wherein.

DETAILED DESCRIPTION

Digital systems may include repairs to post-package memory. The repair may include a modification to a data value within the memory; however these repairs may not be tested prior to permanently enacting the repair in the memory. Additionally, the repair may not be isolated, thus making an error within the memory more difficult to target. These examples may cause disruption to accessing data within the memory, costing much time and resources.

To address these issues, examples disclosed herein a digital circuit may validate a repair to a selected row of data within a memory. Upon the validation of the repair, the digital circuit may determine whether the repair may be considered successful as the memory may operate with minimal errors. Additionally, the validation of the repair to the row of data isolates the repair to a particular row of data in memory to ensure the memory functions without error. This also verifies there may be no other defective rows in the memory.

Additionally the digital circuit may include a control register to enable a first data path to initiate the validation of the repair to the selected row of data, a second data path to represent the selected row of data prior to the repair, and a third data path to represent the repair. Enabling each of these data paths enhances the repair process by providing a temporary repair with short delays. The temporary repair may last until the next power cycle at which point data values across the selected data row may revert to the data values prior to the repair.

In another example discussed herein the digital circuit may include a data register to select the row of data among multiple rows within the memory to validate the repair. Providing the digital circuit to validate the particular row enables the repair to be isolated to consider whether the digital system may be operating with minimal errors. Isolating the repair saves much time and resources, thus increasing the efficiency of the digital system.

In summary, examples disclosed herein provide a mechanism to validate a repair to a particular row of data within a memory. Validating the repair enhances the repair process in that the repair may be isolated and tested within the memory post-packaging.

Figure 1:
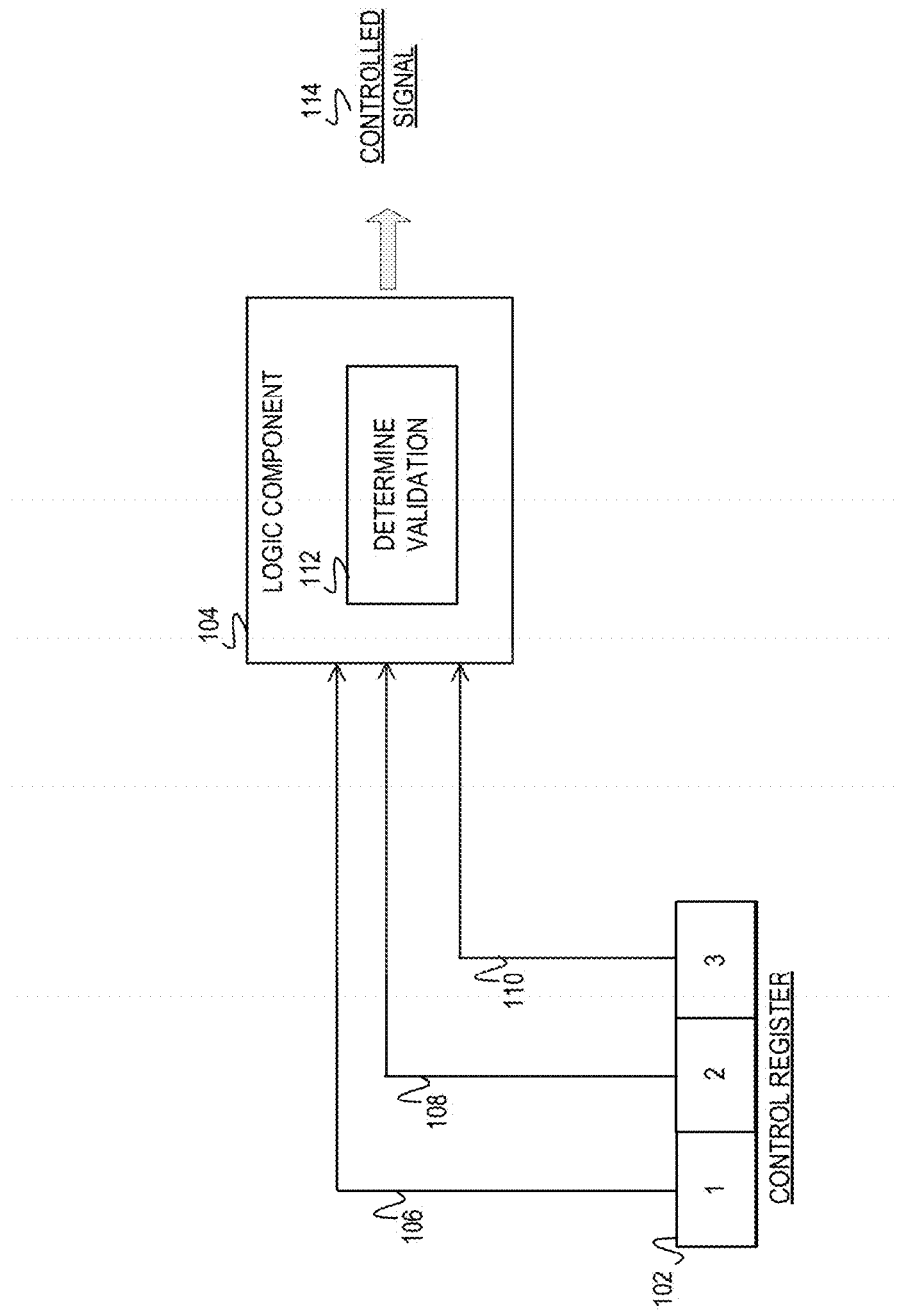
FIG. 1 is a block diagram of an example digital circuit including a control register to enable a first data path, a second data path, and a third data path for determining at a logic component whether a repair to a selected row of data is successful.

Referring now to the figures, FIG. 1 is a block diagram of an example digital circuit including a control register 102 which contains functional enablement bits. The functional enablement bits may enable a first data path 106, a second data path 108, and a third data path 110 as input into a logic component 104 for validating a repair to a selected row of data (not illustrated) at module 112. Based on the validation of the repair at module 112, a controlled signal 114 may indicate the success or failure of the validation of the repair. FIG. 1 represents the digital circuit for validation of the repair to the selected row of data. The digital circuit includes access to a memory array which consists of multiple rows of data. The memory array includes multiple columns and multiple rows of which at each intersection of the column and row a data bit value is stored. Thus each row of data includes multiple data bit values. The repair to a given row of data may include modifying at least one of the data bit values in that given row. For example, the data bit value reading "0," may be modified to the data bit value "1," and vice versa. Validating the repair to the row of data ensures functionality of a memory array consisting of multiple rows of data is working. In one implementation, the digital circuit validates a post-package repair to the memory array to verify there are no defective data rows in the memory array without interfering the functioning of the other rows in the memory array. In another implementation, the digital circuit in FIG. 1 may further include a data register (not illustrated). The data register selects the row of data for validation of the repair. As such, the data register may include a value which corresponds to the multiple rows in the memory array. Thus, the value may correspond to the selection of the row of data for validation of the repair. This implementation is described in detail in the next figure.

The control register 102 is a hardware register which controls the functioning of the first data path 106, the second data path 108, and the third data path 110 through the control function enablement bits. Each of the control functional enablement bits as indicated at 1, 2, 3 enables an operation of the respective data path. The control register 102 may write a value to enable at least one of the data paths 106, 108, and 110 upon validating the selected row of data. In one implementation, each row of data in the memory array includes a different control register 102. This implementation is discussed in further detail in a later figure.

The first data path 106, enabled from the control register 102, is a first logical input to the logic component 104. The first logical input may include transmitting a logical value, such as 0 or 1, along the first data path 106 to the logic component 104. The first data path 106 is a mechanism which represents an initiation of the validation of the repair. In this manner, enabling the first data path 106 directs the digital circuit to validate the repair to a particular row of data within the memory. In one implementation, the first data path 106 travels to a fusible link which may be opened, thus enabling the validating the repair. In this implementation, a data register (not illustrated) directs the digital circuit to validate a specific row of data. The data register and the control register 102 may operate to apply a voltage to the fusible link, thus causing the disconnection across the fusible link. This implementation may be discussed in detail in the next figure.

The second data path 108, enabled from the control register 102, is a second logical input to the logic component 104. The second logical input may include transmitting the logical value, such as a 0 or 1, along the second data path 108 to the logic component 104. The second data path 108 is a mechanism which represents the selected row of data without the repair. In this manner, the second data path 108 may include the selected row of data prior to the repair. For example, if the repair includes modifying one of the data values within the selected row, the second data path 108 includes the data values without the modification. In one implementation, the second data path 108 bypasses the fusible link to temporarily reverse the fusible link to validate whether the repair has occurred at the selected row of data. This implementation may be discussed in detail in the next figure.

The third data path 110, enabled from the control register 102, is a third logical input to the logic component 104. The third logical input may include transmitting the logical value, such as a 0 or 1, along the third data path 110 to the logic component 104. The third data path 110 is a mechanism which represents the repair to the selected row of data. The third data path 110 is considered a soft program path in the sense the modeled repair is temporary if deemed unsuccessful upon the validation at module 112. Upon receiving each of the logical inputs from the respective data paths 106, 108, and 110, the digital circuit may step through various operations of functionality of the memory with the repair to the selected data row. This may indicate whether the memory is operating successfully with the repair.

The logic component 104 receives inputs from each of the data paths 106, 108, and 110 and outputs the controlled signal 114. The logic component 104 uses inputs from each of the data paths 106, 108, and 110 to determine whether the repair made to the selected row of data is successful as at module 112. The logic component 104 may include a logic gate which is a physical device or electrical component implementing a Boolean function. The logic component 104 performs a logical operation from the logical inputs from each of the data paths 106, 108, and 110. As such, the logic component 104 uses the logical inputs to output the controlled signal 114. The controlled signal 114 indicates to software and/or firmware running on a controller whether the repair was successful. If the repair was determined successful as at module 112, that firmware and/or software may permanently write the repair to the selected row of data. If the repair was determined unsuccessful at module 112, the firmware and/or software running on the controller may change the data values within the selected row back to the values prior to the repair. Although FIG. 1 illustrates the logic component 104 as a single component, this was done for illustration purposes. For example, the logic component 104 may include multiple logic components. In one implementation, the logic component 104 may include multiple AND gates and/or OR gates to determining the validation of the repair at module 112. Implementations of the logic component 104 include the logic gate, electronic gate, logic circuit, programmable logic device, or other logical component capable of receiving logical inputs and outputting the controlled signal 114.

At module 112, the repair to the selected row of data may be validated. Validating the repair to the selected row of data enables the digital circuit to determine whether the repair was successful. Although FIG. 1 illustrates the module 112 as a different component to the logic component 104, this was done for illustration purposes. For example, the module 112 may include a logic gate as part of the logic component 104. Implementations of the module 112 include an instruction, set of instructions, process, operation, logic, technique, function, firmware, and/or software executable by the logic component 104 to determine whether the validation of the repair is successful.

The controlled signal 114 is an output from the logic component 104 which indicates whether the validation of the repair to the selected row of data was successful. If the validation of the repair to the selected row was unsuccessful, the controlled signal 114 may communicate to an address row decoder (not illustrated) to access another row of data for validation of the repair to that row of data. If the validation of the repair to the selected row was successful, the controlled signal 114 may indicate to the make the repair to the selected row of data permanent. These implementations may be discussed in detail in a later figure.

Figure 2:
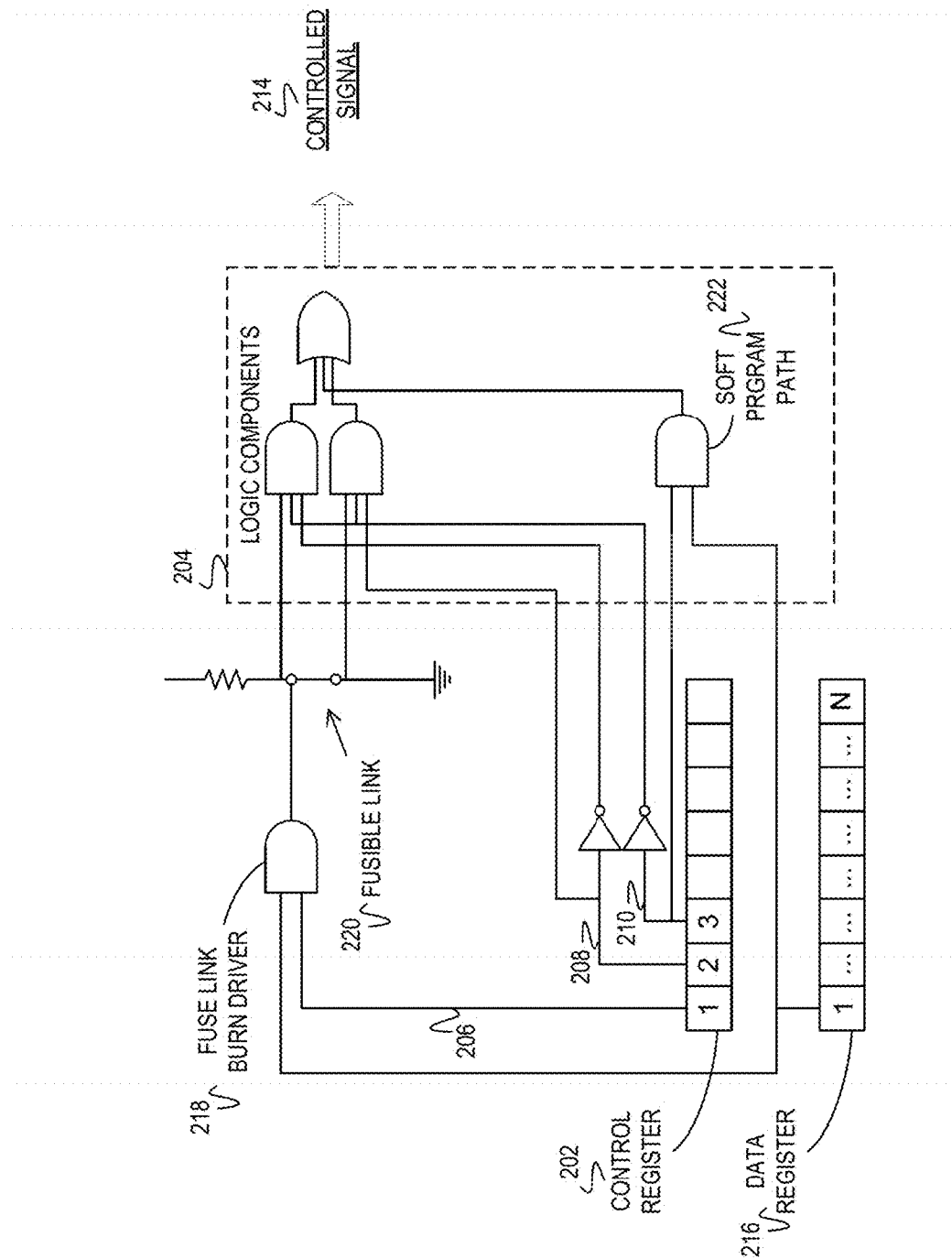
FIG. 2 is a block diagram of an example digital circuit including a data register for selecting a row of data for validating a repair made at the selected row data, the digital circuit includes a control register to enable a first data path to a fusible link, a second data path for representing the selected row of data prior to the repair, and a third data path for representing the repair.

FIG. 2 is a block diagram of an example digital circuit including a data register 216 for selecting a row of data for validating a repair made to the selected row of data. The digital circuit includes a control register 202 to enable functional bits (1, 2, and 3) for enabling a respective data path 206, 208, and 210. The control register 202 sets up a first functional bit (1) to enable the first data path 206 to a fusible link 220 for initiating the validation of the repair to the selected row of data. The first data path 206 operates with the data register 218 to disconnect the fusible link 220 through the fusible link burn driver 218. The control register 202 may also set up a second functional bit (2) to enable the second data path 208 for representing the selected row of data prior to the repair. Additionally, the control register 202 may set up a third functional bit (3) to enable the third data path 210 for representing the repair made to the selected row of data. The third data path 210 enables a soft program path 222 through a logical AND gate. The soft program path 222 enables the third data path 210 to model a temporary repair to the selected row of data. Providing the temporary repair, the selected row of data may revert back to data values prior to the repair if the repair is deemed unsuccessful.

Each of the data paths 206, 208, and 210 is a logical input into logic components 204. The logic components 204 in turn produce a controlled signal 214 which may indicate to software and/or firmware operating in conjunction with a controller whether the repair to the selected row of data was successful. The software and/or firmware operating in conjunction with the controller may run through multiple operations to determine whether the memory may have an error. Determining the memory is with the error indicates the repair to the selected data row was unsuccessful. Upon determining the repair was unsuccessful, the controller may revert the data values in the selected row to values prior to the repair. In this implementation, the controlled signal 214 may indicate for the software and/or firmware to select another row of data for validating the repair to the other row of data. Additionally in this implementation, an address decoder may communicate with a memory to access the other row of data. These implementations are discussed in detail in the next figure. Upon determining whether the repair to the selected row of data was successful, the controller may permanently implement the repair into the selected row of data. The control register 202, the first data path 206, the second data path 208, the third data path 210, the logic components 204, and the controlled signal 214 may be similar in structure and functionality to the control register 102, the first data path 106, the second data path 108, the third data path 110, the logic component 104, and the controlled signal 114 as in FIG. 1.

The data register 216 is a hardware register which includes an enablement value to select various rows of data. In this manner, the data register 216 selects the particular row of data in which to validate the repair to that row of data. For example, in FIG. 2, the first row of data is selected to validate the repair to the first row of data. The data register 216 may receive a value written into the various sections to indicate which row to validate. In this implementation, the controller may track which row of data may have received the repair and write the value into the data register 216 for selecting that particular row of data for validation. The data register 216 tracks multiple rows of data across the memory while the control register 102 tracks each row of data. In the implementation, a digital system may include a single data register 216 and multiple control registers 102 depending on the number of rows in the memory. For example, the data register 216 may be associated with multiple digital circuits, each digital circuit corresponds to a different row of data. As illustrated in FIG. 2, the first data path is selected by the data register 216 for validation while the other rows of data up to N number of rows remain unselected. The data register 216 may be similar in functionality to the control register 102 as in FIG. 1.

The fuse link burn driver 218 is a logical AND gate which includes inputs from both the control register 202 and the data register 216. The fuse link burn driver 218 controls which fusible link to open up, thus initiating the validation of the repair. In this manner, both the data register 216 and the control register 202 must read a high to enable the first link burn driver 218 to burn out the fusible link 220. The fusible link 220 burns out or opens for the validation of the repair to the selected row of data at the data register 216 to occur. In this implementation, the fusible link 220 receives the high reading as an input voltage, thus creating the burn out across the fusible link 220. When the fusible link 220 opens, the logical inputs to two of the AND gates in the logic components 204 may read low. For example, if the control register 202 data bit is a 0, the fusible link 220 does not burn out, thus not initiating the validation of the repair.

The logic components 204 may include multiple logic gates to receive logical inputs, such as 0s and 1s, from each of the data paths 206, 208, and 210. Depending on the logical inputs from each of the data paths 206, 208, and 210, the logic component may respond in a corresponding manner. For example, if the control register 202 enables the second data bit to read low, the second path 206 is not activated. If the control register 202 enables the second bit to read high, this activates the second data path 206 as to read as the high logical input to the top two AND gates. In this example, this enables the AND gate to model the state of the selected row of data prior to the repair. In another example, if the control register 202 enables the third data bit to read low, this disables the soft program path 222. If the control register 202 enables the third data bit to read high, the soft program path 222 is enabled thus modeling the repair state to the selected row of data.

In response to the logical inputs, the logic components 204 produce the controlled signal 214 which may access additional rows of data through an address decoder. The controlled signal 214 indicates to software and/or firmware operating in conjunction with the controller to determine if the appropriate behavior is present in the digital system. In other words, the controlled signal 214 indicates whether the repair to the selected row of data has elicited the appropriate feedback in operating the memory. This implementation is discussed in detail in the next figure.

Figure 3:
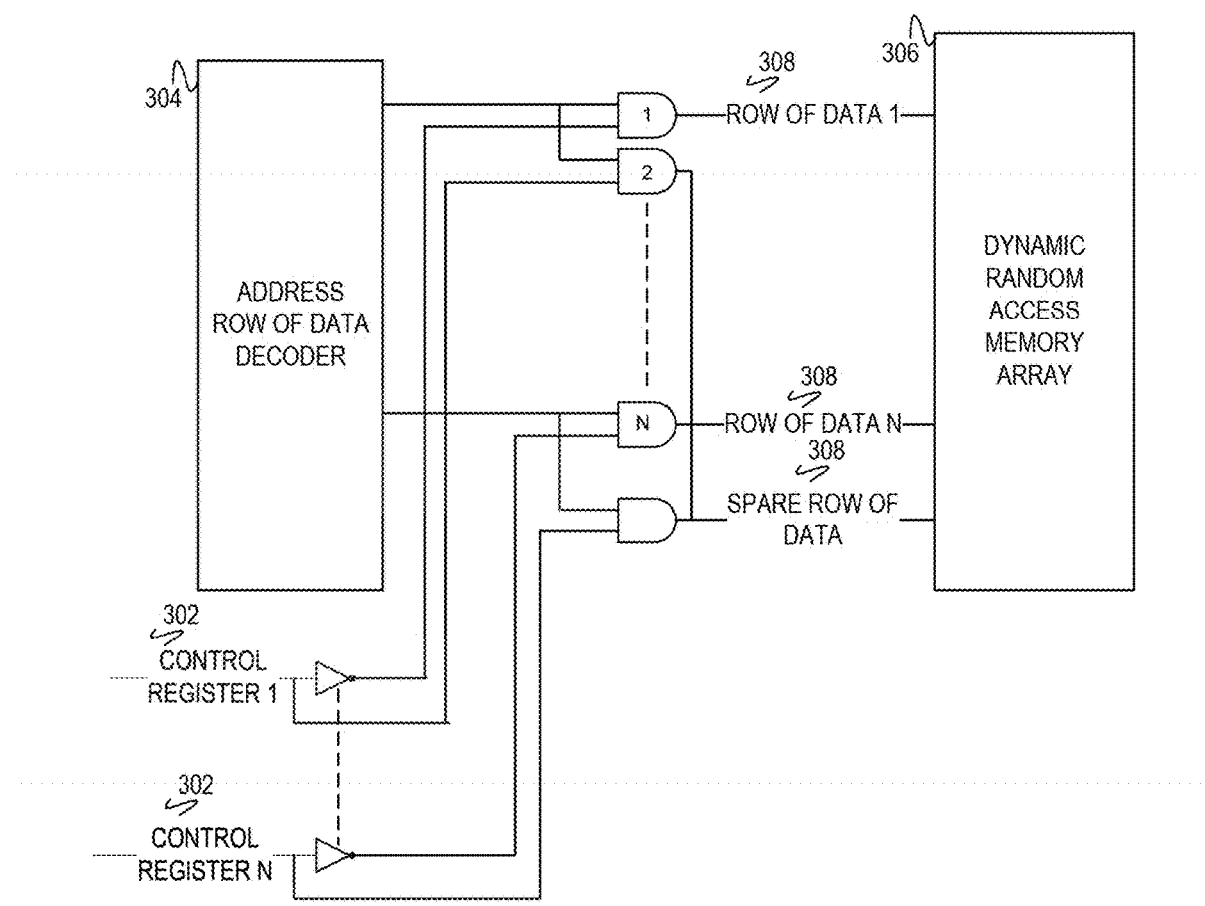
FIG. 3 is a block diagram of an example address row of data decoder to access a selected row of data from a memory, the selected row of data is validated for determining whether a repair to the selected row of data is successful.

FIG. 3 is a block diagram of an example of address row of data decoder 304 to access a selected row of data from a dynamic random access memory array 306. The selected row of data may be validated for determining whether a repair to the selected row of data is successful. Each row of data 308 includes a respective control register 302 within its own respective digital circuit in FIGS. 1-2. Additionally, the rows of data 308 (Row of Data 1, Row of Data N, and Spare Row of Data) includes the data register such as the data register 216 as in FIG. 2. The data register determines which of the rows of data 308 to access for validation by its respective digital circuit. In this manner, the data register selects the row of data among the multiple rows of data 308 for the digital circuit to validate the repair.

The address row of data decoder 304 decodes the address to the selected row of data among the multiple rows of data 304. For example, the address to the selected row of data may include multiple bits of data. More specifically in this example, the address may include $2^N$ bits of data, thus the address row of data decoder 304 decodes the address for demarcation of the selected row of data from the other multiple rows of data 308. This enables the data register to select the row of data which should be validated due to the repair the selected row of data. As such, the address row of data decoder 304 may include a logic gate, such as an AND gate, for the respective control register 302 and the address row of data decoder 304 to access the specific row of data. In another implementation, the controlled signal 114 and 214 as in FIGS. 1-2 may indicate to the address row of data decoder 304 whether the validation was unsuccessful. This may signal to the address row of data decoder 304 to access a different row of data for validation.

The multiple rows of data 308 illustrate the rows of data within the dynamic random access memory array 306. In one implementation, if one of the rows of data 308 is considered to contain an error or fault, a controller may reroute access to the faulty row of data to the spare row of data.

The dynamic random access memory (DRAM) array 306 may store a bit of data at an intersection of each row of data with a column of data. A software and/or firmware operating in conjunction with a controller (not illustrated) tracks which of the rows of data 308 may have had a repair to at least one of the data bit values. In this manner, the controller may transmit a signal to the data register which rows of data 308 to validate upon the repair to each of the rows of data 308. Additionally, the software and/or firmware operating in conjunction with the controller may implement the repair permanently to the selected row of data if deemed successful. If the repair is deemed unsuccessful, the controller with the firmware and/or software may revert the data bit values in the selected row of data to the data values prior to the repair. In this implementation, the controller may utilize the spare row of data to write the permanent data values and/or temporary data values to the selected row of data. Although FIG. 3 illustrates the DRAM array 306 as containing the multiple rows of data 308, implementations should not be limited as the DRAM array may further contain multiple columns of data, etc.

Figure 4:
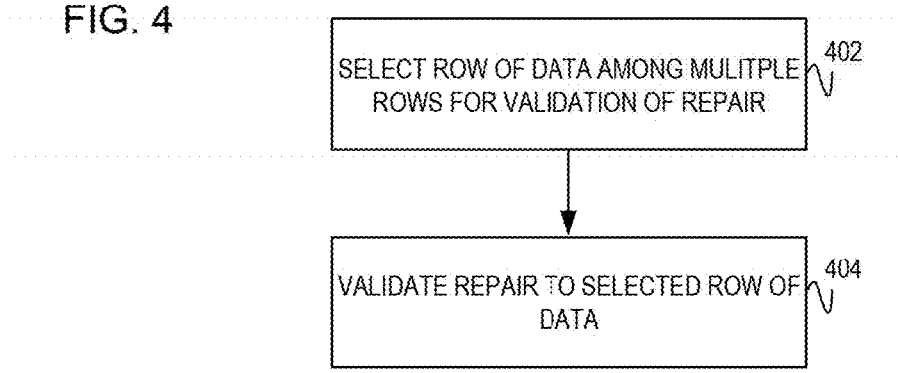
FIG. 4 is a flowchart of an example method to select a row of data among multiple rows of data for validation or repair to the selected row of data.

FIG. 4 is a flowchart of an example method executable by a computing device to select a row of data among multiple rows of data. The method may proceed to validate a repair to the selected row of data. In one implementation, if the validation of the repair is unsuccessful, the method may proceed to validate a different row of data. The flowchart in FIG. 4 represents the validation of the repair occurring at a particular row of data within a memory array. In this implementation, the method provides a mechanism to validate a post-package repair to the memory array to verify there are no defective parts in the memory array. The method verifies there are not defective parts in the memory array without interfering with other aspects of the memory array. In another implementation a controller may execute operations 402-404. In another implementation a processor 602 as in FIG. 6 may execute operations 402-404. In discussing FIG. 4, references may be made to the components in FIGS. 1-3 to provide contextual examples. In one implementation, the computing device may include the digital circuit as in FIG. 1 to execute operations 402-404 to validate the repair to the selected row of data. In another implementation of FIG. 4, the computing device may include the digital circuit as in FIG. 2 to execute operations 402-404. Further, although FIG. 4 is described as implemented by a computing device, it may be executed on other suitable components. For example, FIG. 4 may be implemented in the form of executable instructions on a machine-readable storage medium 604 as in FIG. 6.

At operation 402, the digital circuit selects the row of data among multiple rows of data for validation of the repair to the row of data. The repair to the row of data may include modifying at least one of the bits of data in the row. For example, the memory may consist of multiple columns and multiple rows of which a bit of data of "1," or "0," may be at each of the intersections of the columns and the rows. Thus, a data bit value reading "1," may be modified to "0," and vice versa. Operation 402 may include a data register which may include multiple values of data, each value corresponding to each row of the multiple rows of data. Thus, the value may be enabled in the data register indicating the particular row of data which should be validated. In this manner, the data register selects the row of data to validate the repair. In this implementation, the data register selects a fusible link to be burned or opened indicating the particular row of data for validation. In this implementation, the data register can either be directly written from the controller which may track which rows of data may have undergone the repair. By enabling fusible link, the data register enables the first data path which initiates the validation of the selected row of data which corresponds to that fusible link. The selected row of data may further be validated through enabling a second data path and a third data path as explained in connection with operation 404. In another implementation, the row of data may be selected post-repair to the row of data. The controller associated with the digital circuit may track which row of data may have had a repair and thus indicate to the digital circuit to select that row of data for validation of the repair.

At operation 404, the digital circuit validates the repair to the selected row of data. In one implementation, a control register 102, 202, and 302 as in FIGS. 1-3 contains a control function enablement bits to enable a first data path, a second data path, and a third data path. The first data path provides a mechanism which enables validation by opening the fusible link. The second data path enables a mechanism which may unmake a repair by bypassing the fusible link. The second data path may bypass the fusible link to temporarily reverse the fusible link for validation purposes. In this manner, the second data path models the row of data prior to the repair. The third data path provides a mechanism which models the temporary repair. The third data path enables a soft method for modeling the repair prior to making the repair permanent. Each of the data paths is used as input into a logic component 104 as in FIG. 1. This implementation is discussed in detail in the next figure. Depending on the output from the logic component, the validation may either be considered successful or unsuccessful. In one implementation, if the repair to the selected row of data is successful the repair may be permanently written to the selected row of data. In another implementation, if the repair to the selected row of data is unsuccessful, the selected row of data may revert to the data in that row prior to the repair. In this implementation, the digital circuit may attempt to validate another row of data.

Figure 5:
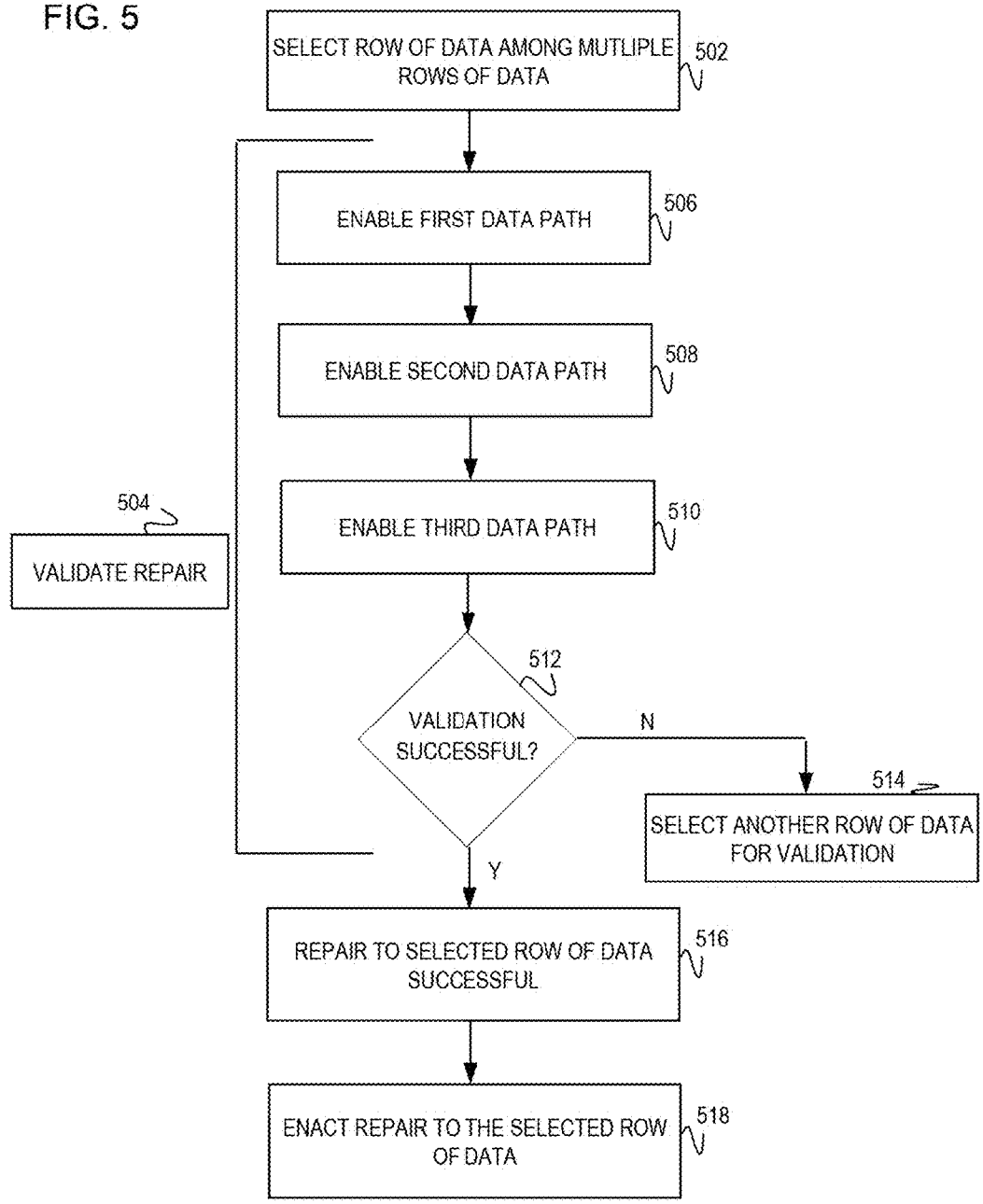
FIG. 5 is a flowchart of an example method to select a row of data among multiple rows of data and to validate a repair to the selected row of data by enabling a first data path, a second data path, and a third data path.

FIG. 5 is a flowchart of an example method executable by a computing device to select a row of data among multiple rows of data in a memory array. The selected row of data may be validated for a repair to the selected row of data. The validation of the repair may occur through enabling a first path to initiate a fusible link for the validation, a second path to model the selected row of data prior to the repair, and a third data path to model the repair to the selected row of data. Based upon whether the repair is considered successful, the method may proceed to permanently enact the repair to the selected row of data. If the validation of the repair is considered unsuccessful, the method may proceed to revert the bits of data in the selected row of data to the value(s) prior to the repair. Additionally, in this implementation, the method may also proceed to select another row of data for validation of a repair made to one of the other rows of data in the memory array. The second and third data paths provide a temporary repair in the case the repair is unsuccessful, the selected row of data may revert to the condition prior to the repair. This provides the ability to isolate the repair to a particular row of data and validate the repair to that particular row of data. In discussing FIG. 5, references may be made to the components in FIGS. 1-3 to provide contextual examples. In one implementation, the computing device includes the digital circuit as in FIG. 1 to execute operations 502-518 for validation of the repair to the selected row of data. In another implementation of FIG. 5, the computing device may include the digital circuit as in FIG. 2 to execute operations 502-518. Further, although FIG. 5 is described as implemented by a computing device, it may be executed on other suitable components. For example, FIG. 5 may be implemented in the form of executable instructions on a machine-readable storage medium 604 as in FIG. 6.

At operation 502, the digital circuit selects the row of data for validation of the repair at the selected row of data. The row of data may be selected among the multiple rows of data within the memory array. Operation 502 may include writing values into a data register, in which a value may indicate which row of data to select for validating the repair. In this implementation, a controller associated with the digital circuit may track which rows of data may have repairs, thus the controller may write values into the data register to indicate which rows of data to validate for the repairs. The data register may include multiple values, each value corresponding to each of the rows of data in the memory array. Thus, the value written into the data register corresponds to the selected row of data for the validation at operation 504. Operation 502 may be similar in functionality to operation 402 as in FIG. 4.

At operation 504, the digital circuit validates the repair to the selected row of data. As explained earlier, the selected row of data includes various bits of data. As such, the repair to the selected row of data may include a modification to at least one of the bits of data. For example, the selected row of data may include the bit value of "0," thus the repair may include modifying the bit value to "1." In one implementation, a control register corresponding to the selected row of data may enable the first data path, the second data path, and the third data path as at operations 506-510. Each of the data paths may be provided as input into a logic component within the digital circuit. The output from the logic component may indicate whether the validation of the repair was successful as at operation 512. The control register contains the control function enablement bits for enabling each of the data paths at operations 506-510. Operation 504 may be similar in functionality to operation 404 as in FIG. 4.

At operation 506, the digital circuit enables the first data path from the control register to a fusible link. In this implementation, the control register may enable the first data path by providing a power to a fusible link to open. Opening the fusible link initiates the validation of the repair to the row of data selected at operation 502. Upon initiating the validation of the repair, the method may proceed to operation 508 to enable the second data path.

At operation 508, the digital circuit enables the second data path from the control register to the logic component. The second data path bypasses the fusible link opened at operation 506 for representing the selected row of data prior to the repair. For example, the second data path may represent the data bit values in the selected row of data prior to the repair. The second data path enables the digital circuit to determine whether the repair has occurred. In one implementation, the second data path represents the original state of the selected row of data without enabling a software controlled data path.

At operation 510, the digital circuit enables the third data path from the control register to the logic component. The third data path represents the repair to the selected row of data. In this manner, the third data path models the repair to the selected row of data as a temporary repair. In this regard, the third data path is a soft program path so if the validation of the repair is unsuccessful, the repair may be undone, or in other words, the selected row of data may revert to the values of data bits prior to the repair. The third data path may be used to model the repair prior to making the permanent repair if the validation of the repair is successful as at operations 516-518.

At operation 512, the digital circuit may determine whether the repair to the selected row of data was successful. Operation 512 may include the controller reading the output value from the logic component. This value may indicate to the controller whether the repair to the selected row of data was successful. In this implementation, the controller may operate other processes to determine whether the memory array operates without error. If the controller determines there is an error with the repair to the selected row of data, this indicates the repair to the selected row of data was unsuccessful and thus the method may proceed to operation 514. If the controller determines the repair to the selected row of data was successful the method may proceed to operations 516-518 to permanently enact the repair to the selected row of data. Success of the repair signifies the memory array with the multiple rows of data are operating within normal range and thus operating with minimal error.

At operation 514, if the repair to the selected row of data is deemed unsuccessful at operation 512, the method may proceed to select another row of data for validation of the repair to the other selected row of data. This enables the digital circuit to step through each row of data among the multiple rows of data to isolate the repair to the row of data and determine if the memory array is operating with minimal error. Operation 514 provides a failure analysis of a repair to each row of data within the memory array. In another implementation of operation 514, the selected row of data may revert back to the value(s) prior to the repair if the validation is unsuccessful. This provides a temporary mechanism to test the repair to the select row of data enables the repair to be undone if considered unsuccessful.

At operations 516-518, upon determining the repair to the selected row of data was successful, the repair may be permanently enacted at the selected row of data. In this manner, the digital circuit may test whether the repair may work with minimal error in the memory array prior to making the repair permanent to the selected row of data.

Figure 6:
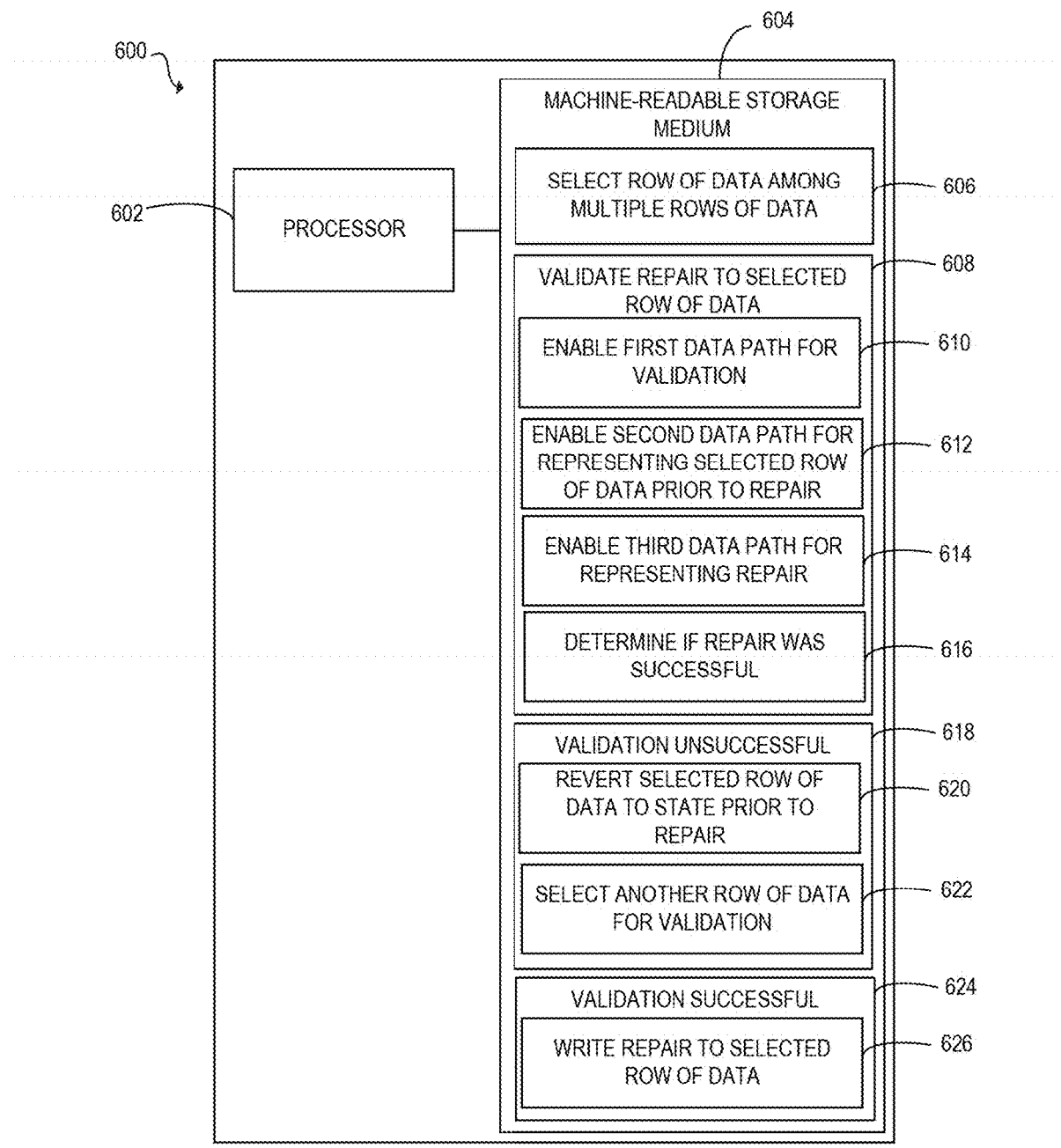
FIG. 6 is a block diagram of an example computing device with a processor to execute instructions in a machine-readable storage medium for selecting a row of data among multiple rows of data for validation of a repair of the selected row of data, if the validation is unsuccessful the instructions include selecting another row of data for validation.

FIG. 6 is a block diagram of computing device 600 with a processor 602 to execute instructions 606-626 within a machine-readable storage medium 604. Specifically, the computing device 600 with the processor 602 is to validate a repair to a selected row of data and determine whether the validation is successful. If the validation is unsuccessful, the instructions may include a reversion of the selected row of data to a state prior to the repair and select another row of data for validation of the repair. Although the computing device 600 includes processor 602 and machine-readable storage medium 604, it may also include other components that would be suitable to one skilled in the art. For example, the computing device 600 may include the logic component 104 as in FIG. 1 and/or the dynamic random access memory array 306 as in FIG. 3. The computing device 600 is an electronic device with the processor 602 capable of executing instructions 606-626, and as such embodiments of the computing device 600 include a mobile device, client device, personal computer, desktop computer, laptop, tablet, video game console, or other type of electronic device capable of executing instructions 606-626. The instructions 606-626 may be implemented as methods, functions, operations, and other processes implemented as machine-readable instructions stored on the storage medium 604, which may be non-transitory, such as hardware storage devices (e.g., random access memory (RAM), read only memory (ROM), erasable programmable ROM, electrically erasable ROM, hard drives, and flash memory).

The processor 602 may fetch, decode, and execute instructions 606-626 for validating the repair to the selected row of data to determine whether the validation was successful. In one implementation, upon executing instructions 606, the processor 602 may execute instruction 608 through one or combination of instructions 610-616. In another implementation if the validation of the repair is unsuccessful, upon executing instructions 606-616, the processor 602 may execute instructions 618-622. In a further implementation, if the validation of the repair is successful, the processor 602 may proceed to execute instructions 624-626. Specifically, the processor 602 executes instructions 606-616 to: select the row of data among the multiple rows of data in a memory array; validate the repair to the selected row of data; enable a first data path for validation of the repair to the selected row of data, the first data path opens a fusible link; enable a second data path for representing the selected row of data prior to the repair; enable a third data path for representing the repair to the selected row of data; and determining whether the repair to the selected row of data was successful. If the validation of the repair to the selected row of data was unsuccessful, the processor 602 may proceed to execute instructions 618-622 to: determine the validation of the repair was unsuccessful; revert the selected row of data to the state prior to the repair, thus providing a temporary repair to the selected row of data; and select another row of data for validation of the repair to the other selected row of data. If the validation of the repair to the selected row of data was successful, the processor 602 may proceed to execute instructions 624-626 to: write the repair permanently to the selected row of data.

The machine-readable storage medium 604 includes instructions 606-626 for the processor 602 to fetch, decode, and execute. In another embodiment, the machine-readable storage medium 604 may be an electronic, magnetic, optical, memory, storage, flash-drive, or other physical device that contains or stores executable instructions. Thus, the machine-readable storage medium 604 may include, for example, Random Access Memory (RAM), an Electrically Erasable Programmable Read-Only Memory (EEPROM), a storage drive, a memory cache, network storage, a Compact Disc Read Only Memory (CDROM) and the like. As such, the machine-readable storage medium 604 may include an application and/or firmware which can be utilized independently and/or in conjunction with the processor 602 to fetch, decode, and/or execute instructions of the machine-readable storage medium 604. The application and/or firmware may be stored on the machine-readable storage medium 604 and/or stored on another location of the computing device 600.

In summary, examples disclosed herein provide a mechanism to validate a repair to a particular row of data within a memory. Validating the repair enhances the repair process in that the repair may be isolated and tested within the memory post-packaging.

What is claimed is:

1. A digital circuit comprising:
    a control register configured to:
        enable a first data path that initiates a validation of a repair to a selected row of data among multiple rows of data of a memory array;
        enable a second data path that represents a state of the selected row of data prior to the repair; and
        enable a third data path that represents the repair to the selected row of data; and
    a logic component configured to determine if the repair to the selected row of data is successful; and
    a controller configured to in response to the determination that the validation of the repair to the selected row of data was unsuccessful, revert the selected row of data back to the state prior to the repair; and a fusible link, within the first data path, configured to enable the validation of the repair to the selected row of data, wherein each row of data corresponds to a different fusible link.

2. The digital circuit of claim 1 further comprising:
    a data register configured to identify the selected row of data among the multiple rows of data; and
    the logic component configured to validate the repair to the identified selected row of data.

3. The digital circuit of claim 1 wherein the selected row of data is a dynamic random-access memory (DRAM) and each row of data includes a different bit of data.

4. The digital circuit of claim 1 wherein in response that the repair to the selected row of data was unsuccessful, the controller is further configured to:
    select another row of data, among the multiple rows of data, that enables three different data paths to validate a repair made to the selected another row of data.

5. The digital circuit of claim 1 wherein the logic component is further to:
    in response to the determination that the validation of the repair to the selected row of data was successful, permanently store the state of the repair to the selected row of data.

6. A non-transitory machine-readable storage medium comprising instructions that when executed by a processor cause the processor to:
    select a row of data, among multiple rows of data of a memory array, that includes a temporary repair;
    in response to a determination that the temporary repair was successful, validate the temporary repair to the selected row of data such that the temporary repair becomes a permanent repair;
    in response to the determination that the temporary repair to the selected row of data was unsuccessful, revert the selected row of data back to a state prior to the temporary repair; and enable a first data path that opens a fusible link to initiate the validation of the temporary repair to the selected row of data; enable a second data path that represents the selected row of data prior to the temporary repair; and enable a third data path that represents the repair to the selected row; and determine that the temporary repair to the selected row of data was successful.

7. The non-transitory machine-readable storage medium including the instructions of claim 6 wherein in response to the determination that the temporary repair to the selected row of data was unsuccessful comprises instructions that when executed by the processor cause the processor to:
    select another row of data among the multiple rows of data to validate a different repair made to the selected another row of data.

8. The non-transitory machine-readable storage medium including the instructions of claim 6 wherein in response to the determination that the temporary repair was successful, validate the temporary repair to the selected row of data such that the temporary repair becomes the permanent repair comprises instructions that when executed by the processor cause the processor to:
    write the temporary repair to the selected row of data.

9. The method of claim 6 wherein the multiple rows of data are isolated from one another.

10. A method, executable by a computing device, the method comprising:
    selecting a row of data, among multiple rows of data of a memory array, that includes a temporary repair made to the selected row of data;
    validating the temporary repair made to the selected row of data by a determination of whether the temporary repair was successful or unsuccessful;
    in response to a determination that the temporary pair was successful, writing the temporary repair to the selected row of data such that the temporary repair becomes a permanent repair; and
    in response to the determination that the temporary repair to the selected row of data was unsuccessful, reverting the selected row of data back to a state prior to the temporary repair; and enabling a first data path that opens a fusible link to initiate the validation of the temporary repair made to the selected row of data; enabling a second data path that represents the selected row of data prior to the temporary repair; and enabling a third data path that represents the repair made to the selected row of data.

11. The method of claim 10 wherein in response to the determination that the temporary repair was unsuccessful, the method comprises:

selecting another row of data, among the multiple rows of data, that includes a different temporary repair made to the selected another row of data.

12. The method of claim 10 wherein selecting the row of data, among multiple rows of data, to validate the temporary repair occurs post-repair.

* * * * *